United States Patent
Kristal

(10) Patent No.: US 10,868,214 B2
(45) Date of Patent: Dec. 15, 2020

(54) LIGHT EMITTING DIODE, MANUFACTURING METHOD THEREOF AND DISPLAY DEVICE

(71) Applicant: BOE TECHNOLOGY GROUP CO., LTD., Beijing (CN)

(72) Inventor: Boris Kristal, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/340,224

(22) PCT Filed: Aug. 23, 2018

(86) PCT No.: PCT/CN2018/101949
§ 371 (c)(1),
(2) Date: Apr. 8, 2019

(87) PCT Pub. No.: WO2019/076129
PCT Pub. Date: Apr. 25, 2019

(65) Prior Publication Data
US 2020/0243719 A1 Jul. 30, 2020

(30) Foreign Application Priority Data

Oct. 17, 2017 (CN) .......................... 2017 1 0965441

(51) Int. Cl.
*H01L 33/36* (2010.01)
*H01L 33/04* (2010.01)

(52) U.S. Cl.
CPC .............. *H01L 33/36* (2013.01); *H01L 33/04* (2013.01); *H01L 2933/0016* (2013.01)

(58) Field of Classification Search
CPC .. H01L 33/36; H01L 33/04; H01L 2933/0016
See application file for complete search history.

(56) References Cited

U.S. PATENT DOCUMENTS

2010/0311103 A1* 12/2010 Boukherroub ....... G01N 21/553
435/29
2011/0187264 A1* 8/2011 Yasuda ................... H01L 51/52
313/504

(Continued)

FOREIGN PATENT DOCUMENTS

CN 101123302 A 2/2008
CN 102792772 A 11/2012

(Continued)

OTHER PUBLICATIONS

First Chinese Office Action dated Oct. 9, 2019.
International Search Report and Written Opinion dated Nov. 15, 2018 from State Intellectual Property Office of the P.R. China.

*Primary Examiner* — Karen Kusumaker
(74) *Attorney, Agent, or Firm* — Dilworth & Barrese, LLP.; Michael J. Musella, Esq.

(57) ABSTRACT

A light emitting diode, a manufacturing method thereof and a display device are provided. The light emitting diode includes a first electrode, an active layer and a second electrode. The active layer is on the first electrode; the second electrode is on a side of the active layer away from the first electrode, and includes a first conductive layer and a second conductive layer sequentially arranged along a direction away from the active layer; the first conductive layer includes a plurality of micropores; and the second conductive layer includes a plurality of conductive nanoparticles.

18 Claims, 3 Drawing Sheets

(56) References Cited

U.S. PATENT DOCUMENTS

2012/0138937 A1* 6/2012 Jo ..................... H01L 27/1218
  257/59
2012/0298954 A1 11/2012 Kim et al.
2012/0314189 A1 12/2012 Natsumeda et al.

FOREIGN PATENT DOCUMENTS

| CN | 102800773 A | 11/2012 |
| CN | 103066173 A | 4/2013 |
| CN | 103137840 A | 6/2013 |
| CN | 103247731 A | 8/2013 |
| CN | 103311395 A | 9/2013 |
| CN | 104051587 A | 9/2014 |
| CN | 106206967 A | 12/2016 |
| CN | 106711294 A | 5/2017 |
| CN | 107516699 A | 12/2017 |
| KR | 1020090053307 A | 5/2009 |

* cited by examiner

LIGHT EMITTING DIODE, MANUFACTURING METHOD THEREOF AND DISPLAY DEVICE

The present application claims priority of China Patent application No. 201710965441.9 filed on Oct. 17, 2017, the content of which is incorporated in its entirety as portion of the present application by reference herein.

TECHNICAL FIELD

Embodiments of the present disclosure relate to a light emitting diode, a manufacturing method thereof, and a display device.

BACKGROUND

With the continuous development of display technology, the types of display devices are also increasing. Light emitting diode (LED) display devices have attracted wide attention in the industry due to the advantages such as self-luminescence, high brightness, low operating voltage, low power consumption, long service life, impact resistance and stable performance. Moreover, because the light emitting diode display device does not need to additionally dispose a backlight module and has light weight, the light emitting diode display device facilitates the thinning tendency of the display device and thus has a good market prospect.

Light emitting diodes (LED) are generally classified into organic light emitting diodes (OLED) and inorganic light emitting diodes. Light emitting diodes (LED) can usually be made from a compound of gallium (Ga) and arsenic (As), phosphorus (P), nitrogen (N), or indium (In), and visible light is radiated by the recombination of electrons and holes. For example, a gallium arsenide phosphide diode can emit red light; a gallium phosphide diode can emit green light; a silicon carbide diode can emit yellow light; and an indium gallium nitride diode can emit blue light.

SUMMARY

At least one embodiment of the present disclosure provides a light emitting diode, which includes: a first electrode; an active layer on the first electrode; and a second electrode on a side of the active layer away from the first electrode. The second electrode includes a first conductive layer and a second conductive layer sequentially arranged along a direction away from the active layer, the first conductive layer includes a plurality of micropores; the second conductive layer includes a plurality of conductive nanoparticles, and at least a part of the plurality of conductive nanoparticles is in contact with the active layer through the plurality of micropores.

For example, in the light emitting diode provided by an embodiment of the present disclosure, a thickness of the first conductive layer is less than 10 nm.

For example, in the light emitting diode provided by an embodiment of the present disclosure, the plurality of micropores are irregularly arranged.

For example, in the light emitting diode provided by an embodiment of the present disclosure, a thickness range of the second conductive layer is 10-15 nm.

For example, in the light emitting diode provided by an embodiment of the present disclosure, a material of the first conductive layer includes aluminum.

For example, in the light emitting diode provided by an embodiment of the present disclosure, a material of the second conductive layer includes silver.

For example, in the light emitting diode provided by an embodiment of the present disclosure, the active layer includes a hole transport layer, a light emitting layer and an electron transport layer sequentially arranged along the direction away from the first electrode.

For example, in the light emitting diode provided by an embodiment of the present disclosure, the light emitting layer includes a quantum dot light emitting layer.

For example, the light emitting diode provided by an embodiment of the present disclosure further includes a cover layer located on a side of the second electrode away from the active layer and including a dielectric material, wherein the dielectric material is electrically conductive under a direct current or a low frequency current, and presents a dielectric property in an oscillating electric field with a frequency range of 3.0e+14 Hz to 3.0e+15 Hz.

For example, in the light emitting diode provided by an embodiment of the present disclosure, the dielectric material includes indium zinc oxide (IZO), indium zinc oxide (IZO) or an organic semiconductor material.

At least one embodiment of the present disclosure provides a manufacturing method of a light emitting diode, including: forming a first electrode; forming an active layer on the first electrode; and sequentially forming a first conductive layer and a second conductive layer on a side of the active layer away from the first electrode to form a second electrode, the first conductive layer includes a plurality of micropores; the second conductive layer includes a plurality of conductive nanoparticles; and at least a part of the plurality of conductive nanoparticles is in contact with the active layer through the plurality of micropores.

For example, in the manufacturing method of the light emitting diode provided by an embodiment of the present disclosure, sequentially forming the first conductive layer and the second conductive layer on the side of the active layer away from the first electrode to form the second electrode includes: forming a first metal layer on the side of the active layer away from the first electrode to form the first conductive layer, wherein a thickness of the first conductive layer is less than 10 nm, such that the plurality of micropores are formed in the first conductive layer; forming a second metal layer on a side of the first conductive layer away from the active layer; and performing a thermal annealing process to the second metal layer to convert the second metal layer into the second conductive layer including the plurality of conductive nanoparticles.

For example, in the manufacturing method of the light emitting diode provided by an embodiment of the present disclosure, a temperature range of thermal annealing process is 120-180° C., and a time range of thermal annealing process is 20-80 min.

For example, in the manufacturing method of the light emitting diode provided by an embodiment of the present disclosure, the thermal annealing process is performed in a vacuum or nitrogen atmosphere.

For example, in the manufacturing method of the light emitting diode provided by an embodiment of the present disclosure, a material of the first conductive layer includes aluminum.

For example, in the manufacturing method of the light emitting diode provided by an embodiment of the present disclosure, a material of the second conductive layer includes silver.

At least one embodiment of the present disclosure provides a display device, including the abovementioned light emitting diode.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. The terms "connection", "connected" and the like are not limited to physical or mechanical connection but may include electrical connection, either directly or indirectly.

Figure 1:
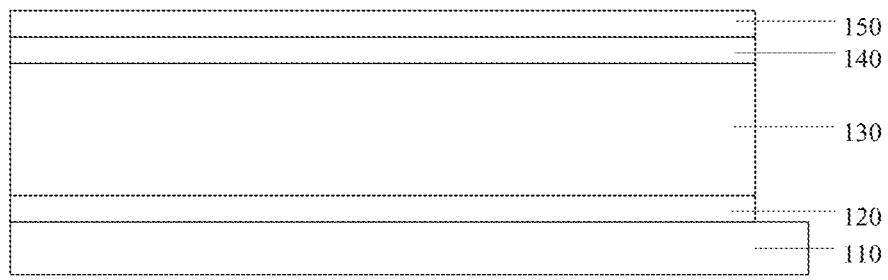
FIG. 1 is a schematic structural view of a quantum dot light emitting diode.

FIG. 1 is a schematic structural view of a quantum dot emitting diode. As illustrated by FIG. 1, the quantum dot emitting diode includes a base substrate 110; an anode 120 on the base substrate 110; an active layer 130 on a side of the anode 120 away from the base substrate 110; a cathode 140 on a side of the active layer 130 away from the anode 120; and a cover layer 150 on a side of the cathode layer 140 away from the active layer 130. The active layer 130 may include a plurality of organic layers and inorganic layers, and a quantum dot light emitting layer. The anode 120 and the cathode 140 can provide holes and electrons for the quantum dot light emitting layer to form excitons. Upon the holes and the electrons being recombined in the quantum dot light emitting layer, light with specific wavelength, e.g., red light, green light and blue light, can be generated. For example, the quantum dot emitting diode may be a light emitting diode with a top-emission structure. That is to say, the anode can be a reflective electrode; the cathode may be a semitransparent electrode; and light generated by the active layer is reflected by the anode and emitted from a side provided with the cathode. In addition, because the light generated by the quantum dot emitting diode has relatively narrow spectrum and relatively pure color and the quantum dot emitting diode also has the advantages such as low power consumption, a display device employing the quantum dot emitting diode can have good image quality, low power consumption and broad market space.

However, in a conventional quantum dot emitting diode, because the electrons and the holes can be recombined in the quantum dot light emitting layer in two manners, one is radiative recombination and the other is non-radiative recombination. Radiative recombination can generate photons, while non-radiative recombination cannot generate photons but generates phonons that typically appear as lattice vibration or heat. In addition, most photons generated by the radiative recombination are limited in structural layers of the quantum dot emitting diode, only a very small part (about 20%) can be emitted out, and the remaining part of light will be lost at different interfaces in the quantum dot emitting diode due to refractive index mismatch, total reflection, etc. Therefore, the luminous efficiency and the light extraction efficiency of the conventional quantum dot emitting diode need to be improved.

Therefore, embodiments of the present disclosure provide a light emitting diode, a manufacturing method thereof and a display device. The light emitting diode includes a first electrode, an active layer and a second electrode. The active layer is disposed on the first electrode; the second electrode is on a side of the active layer away from the first electrode, and includes a first conductive layer and a second conductive layer sequentially arranged along the direction away from the active layer; the first conductive layer includes a plurality of micropores; and the second conductive layer includes a plurality of conductive nanoparticles. Thus, the luminous efficiency and the light extraction efficiency of the light emitting diode can be improved through localized surface plasmons generated by the second conductive layer.

Hereinafter, the light emitting diode, the manufacturing method thereof and the display device provided by the embodiments of the present disclosure will be described in detail with reference to the accompanying drawings.

Figure 2A:
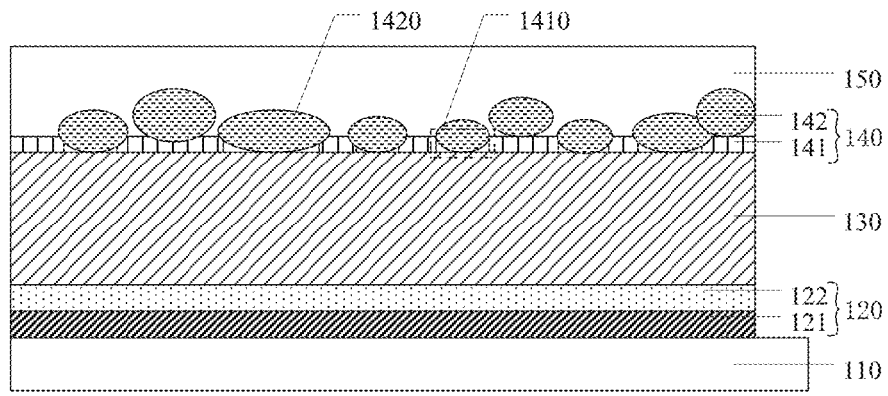
FIG. 2A is a schematic structural view of a light emitting diode provided by an embodiment of the present disclosure.
Figure 2B:
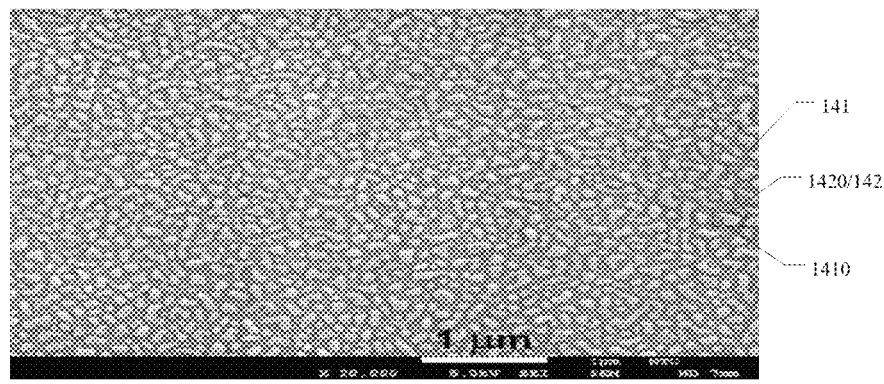
FIG. 2B is a schematic plan view of a second electrode in the light emitting diode as illustrated by FIG. 2A.

An embodiment of the present disclosure provides a light emitting diode. FIG. 2A is a schematic structural view of the light emitting diode provided by the embodiment. FIG. 2B is a schematic plan view of a second electrode illustrated in FIG. 2A. As illustrated by FIGS. 2A and 2B, the light emitting diode includes a first electrode 120; an active layer 130 disposed on the first electrode 120; and a second electrode 140 on a side of the active layer 130 away from the first electrode 120. The second electrode 140 includes a first conductive layer 141 and a second conductive layer 142 sequentially arranged along a direction away from the active layer 130. The first conductive layer 141 includes a plurality of micropores 1410; the second conductive layer 142 includes a plurality of conductive nanoparticles 1420; and at least a part of the plurality of conductive nanoparticles 1420 is in contact with the active layer 130 through the plurality of micropores 1410.

In the light emitting diode provided by the embodiment, the first conductive layer includes a plurality of micropores; the second conductive layer includes a plurality of conductive nanoparticles; and at least a part of the plurality of conductive nanoparticles is in contact with the active layer through the plurality of micropores, so there is electromagnetic interaction between the conductive nanoparticles and the active layer. Thus, because of the localized surface plasmons formed at the conductive nanoparticles, the coupling between an evanescent field of the surface plasmon and the electric dipole in the active layer transfers the energy of the electric dipole into the surface plasmon for emitting light, which provides an alternative light emitting method for the light emitting diode, can improve the internal quantum efficiency of the light emitting diode, and then can improve the luminous efficiency of the light emitting diode. In addition, the localized surface plasmons formed at the conductive nanoparticles can absorb and release the light emitted by the active layer through resonance effect of the localized surface plasmons, so as to improve the light extraction efficiency of the light emitting diode. Moreover, because the second conductive layer includes the plurality of conductive nanoparticles and a surface of the second conductive layer away from the active layer is a rough surface, the total reflection of the light emitted by the active layer on the surface of the second conductive layer away from the active layer can be reduced and even avoided, so the light extraction efficiency of the light emitting diode can be further improved.

Figure 2C:
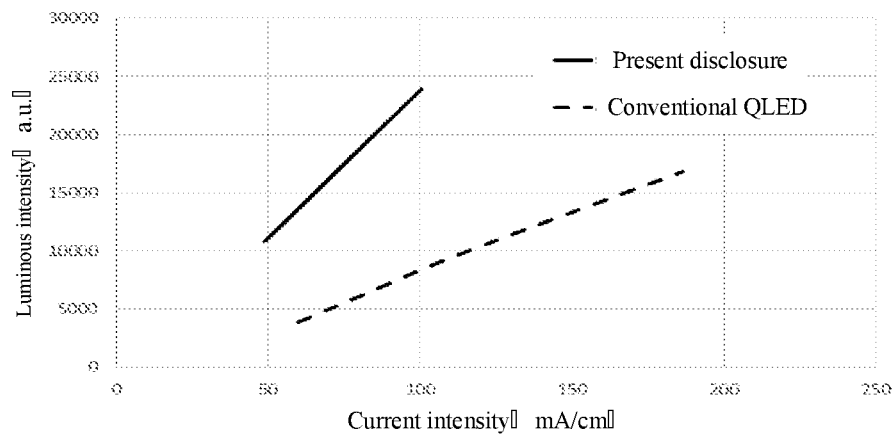
FIG. 2C is a schematic diagram of luminous efficiency of a quantum dot light emitting diode provided by an embodiment of the present disclosure.

For example, in some examples, the light emitting diode provided by the embodiment may be a quantum dot emitting diode. FIG. 2C is a schematic diagram of luminous efficiency of the quantum dot emitting diode provided by the embodiment. As illustrated by FIG. 2C, taking the quantum dot emitting diode as an example, under the action of the localized surface plasmons formed at the conductive nanoparticles, under same current intensity, luminous intensity of the quantum dot emitting diode provided by the embodiment is far greater than that of the conventional quantum dot emitting diode.

For example, a material of the first conductive layer may be aluminum, and a material of the second conductive layer may be silver. Thus, the second electrode formed by the first conductive layer and the second conductive layer can have good electric conductivity. Of course, the present disclosure includes but not limited thereto, and the material of the first conductive layer and the second conductive layer may also select other conductive materials.

For example, a thickness of the first conductive layer is less than 10 nm. Thus, in the process of forming the first conductive layer on a side of the active layer away from the first electrode, due to small thickness, the first conductive layer will not form a continuous film layer but will naturally form a porous structure, namely a structure including a plurality of micropores. Thus, the plurality of micropores on the first conductive layer do not need to be formed by an additional step, so the production costs can be reduced. It should be noted that upon the material of the first conductive layer being aluminum and the thickness of the first conductive layer is less than 10 nm, the first conductive layer can easily form the porous structure.

For example, in some examples, as the micropores are not patterned but naturally formed because the first conductive layer with small thickness cannot form a continuous film layer, the micropores can be irregularly arranged. In addition, the size of the micropore may also be irregular. Of course, the embodiments of the present disclosure include but are not limited thereto.

For example, a surface of the active layer close to the first conductive layer may be a rough surface, so as to form the plurality of micropores on the first conductive layer. For example, the arithmetical mean deviation of the profile Ra of the abovementioned rough surface is greater than 5 nm.

For example, the active layer may include a plurality of sub film layers. In a case where a material of the sub film layer of the active layer close to the first conductive layer is an inorganic material, nanoparticles with the particle diameter of 5-7 nm (For example, ZnO particles) can be doped into the inorganic material to form the abovementioned rough surface. It should be noted that upon the nanoparticles with the particle diameter of 5-7 nm are doped into the inorganic material, the surface of the active layer close to the first conductive layer not only can form the rough surface of which the arithmetical mean deviation of the profile Ra is greater than 5 nm, but also can conveniently form an orderly porous structure on the rough surface. Of course, the embodiments of the present disclosure include but are not limited thereto. In a case where the material of the sub film layer of the active layer close to the first conductive layer is an organic material, the rough surface of which the arithmetical mean deviation of the profile Ra is greater than 5 nm can be directly formed.

For example, the active layer may include a plurality of functional layers, e.g., a hole transport layer, a light emitting layer and an electron transport layer. A functional layer of the active layer close to the first conductive layer may be made from zinc oxide (ZnO) or zinc magnesium oxide (ZnMgO).

For example, a thickness range of the second conductive layer is 10-15 nm.

For example, a range of a size of an orthographic projection of the conductive nanoparticle on the active layer is 30-40 nm. For example, in a case where the orthographic projection of the conductive nanoparticle on the active layer is a circle, the abovementioned size is a diameter of the circle; in a case where the orthographic projection of the conductive nanoparticle on the active layer is a polygon, the abovementioned size is a length of a diagonal line of the polygon.

Figure 3:
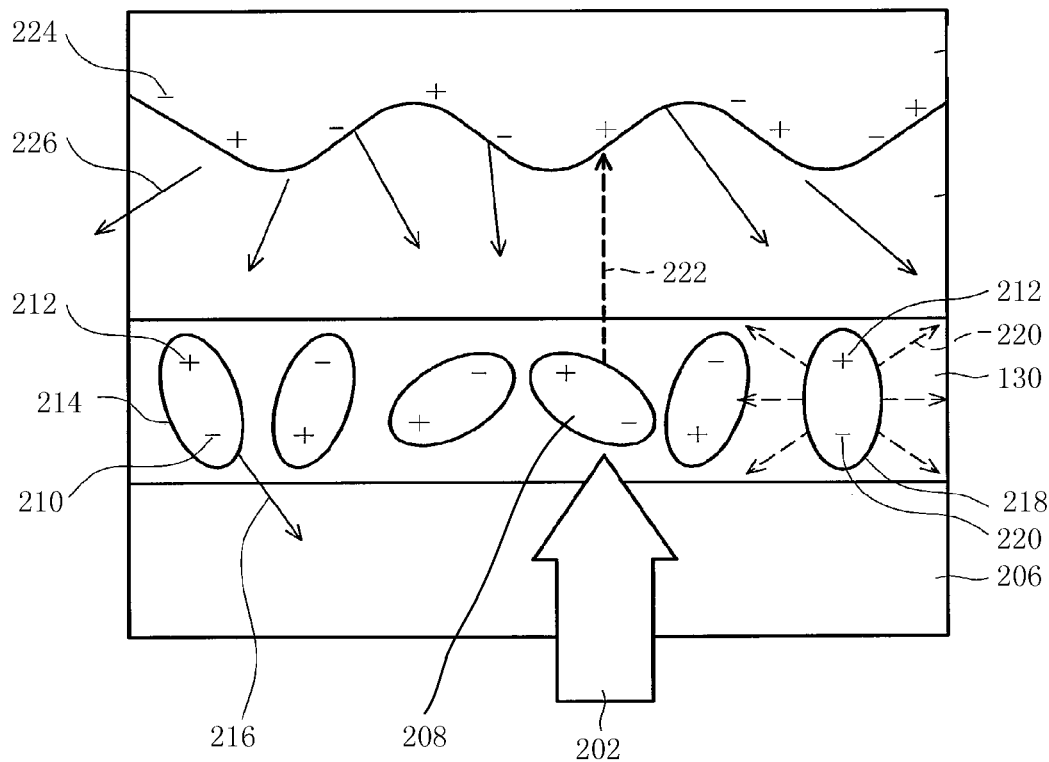
FIG. 3 is a schematic working diagram of a light emitting diode provided by an embodiment of the present disclosure.

FIG. 3 is a schematic diagram of working principle of the light emitting diode provided by the embodiment. As illustrated by FIG. 3, excitation 202 such as a current or a laser is injected into the active layer 130 through a bottom structural layer 206 of the light emitting diode so as to generate electrons 210 and holes 212 in the active layer 130. The electrons 210 and the holes 212 can be recombined by two means, and one is radiative recombination 214 and the other is non-radiative recombination 218. The radiative recombination 214 can generate photons 216. The non-radiative recombination 218 can generate phonons 220 that typically appear as lattice vibration or heat. In the light emitting diode provided by the embodiment, localized surface plasmons 224 can be formed at the conductive nanoparticles (not shown) being in contact with the active layer through the plurality of micropores, so that the coupling 222 between an evanescent field of the surface plasmon 224 and the electric dipole 208 in the active layer 130 transfers the energy of the electric dipole 208 into the surface plasmon 224 for emitting light 226. Thus, the luminous efficiency of the light emitting diode can be improved. It should be noted that the abovementioned bottom structural layer may include the first electrode and other layer structures on a side of the active layer close to the first electrode.

For example, in some examples, the light emitting diode may be a top-emission structure. As illustrated by FIG. 2A, the first electrode 120 may be a reflective electrode and the second electrode 140 may be a semitransparent electrode. Thus, the light emitted by the active layer can be reflected through the first electrode and emitted from a side provided with the second electrode.

For example, as illustrated by FIG. 2A, the first electrode 120 may include a reflective layer 121 and a transparent electrode 122 on a side of the reflective layer 121 close to the active layer 130.

For example, the reflective layer may be made from a metallic material with high reflectivity, e.g., silver, aluminum, or alloy of silver, lead and copper. Of course, the embodiments of the present disclosure include but are not limited thereto, and the reflective layer may also be made from other materials with high reflectivity.

Figure 4:
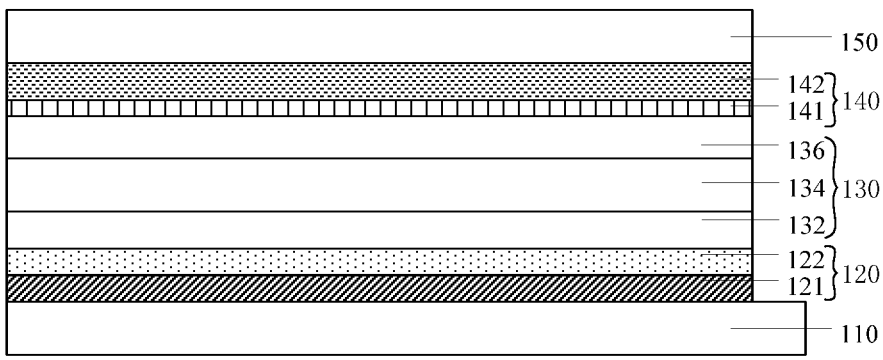
FIG. 4 is a schematic structural view of another light emitting diode provided by an embodiment of the present disclosure.

FIG. 4 is a schematic structural view of another light emitting diode provided by the embodiment. For clarity, as illustrated by FIG. 4, the micropores of the first conductive layer 141 are not shown, and the conductive nanoparticles of the second conductive layer 142 are not shown.

For example, in some examples, as illustrated by FIG. 4, the active layer 130 includes a hole transport layer 132, a light emitting layer 134 and an electron transport layer 136 sequentially arranged along a direction away from the first electrode 120. Thus, the first electrode and the second electrode can provide holes and electrons for the light emitting layer through the hole transport layer and the electron transport layer.

Figure 5:
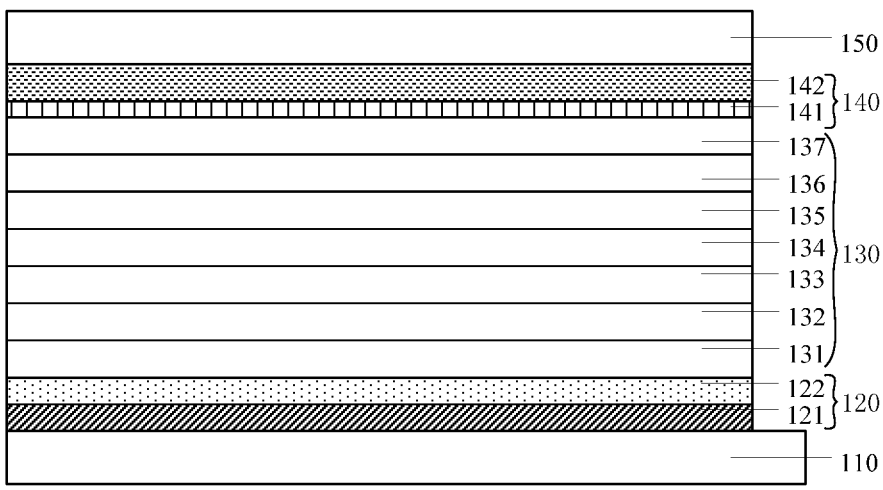
FIG. 5 is a schematic structural view of another light emitting diode provided by an embodiment of the present disclosure.

Of course, the active layer may also include other functional layers. FIG. 5 is a schematic structural view of another light emitting diode provided by the embodiment of the present disclosure. As illustrated by FIG. 5, the active layer 130 further includes a hole injection layer 131, an electron blocking layer 133 disposed between the hole transport layer 132 and the light emitting layer 134, a hole blocking layer 135 disposed between the light emitting layer 134 and the electron transport layer 136, and an electron injection layer 137 disposed between the electron transport layer 136 and the second electrode 140.

For example, in some examples, the light emitting layer is a quantum dot light emitting layer. Because the light emitted by the quantum dot light emitting layer has narrow spectrum and pure color, the color purity of the light emitted by the light emitting diode can be high. In addition, in a case where the material of the second conductive layer is silver and the light emitting layer is a quantum dot light emitting layer, the electron transport layer may be made from inorganic oxide materials, with the LUMO energy level of 4.0-4.4 eV, which is matched with the work function (4.3-4.7 eV) of silver, so the light emitting diode can have high luminous efficiency.

For example, in some examples, as illustrated by FIGS. 2A, 4 and 5, the light emitting diode further includes a cover layer 150 on a side of the second electrode 140 away from the active layer 130. Thus, the cover layer can have the function of protecting the second conductive layer and preventing the second conductive layer from being eroded and oxidized.

For example, the cover layer may be made from a dielectric material. The dielectric material is electrically conductive under a direct current or a low frequency current, and represents a dielectric property in an oscillating electric field with the frequency range of 3.0e+14 Hz to 3.0e+15 Hz, so the second conductive layer can generate localized surface plasmons.

For example, the abovementioned dielectric material includes indium zinc oxide (IZO), indium tin oxide (ITO) or an organic semiconductor material.

For example, in some examples, as illustrated by FIGS. 2A, 4 and 5, the light emitting diode further includes a base substrate 110 on a side of the first electrode 120 away from the active layer 130.

For example, the base substrate may be a glass substrate, a sapphire substrate, a plastic substrate, etc.

Figure 6:
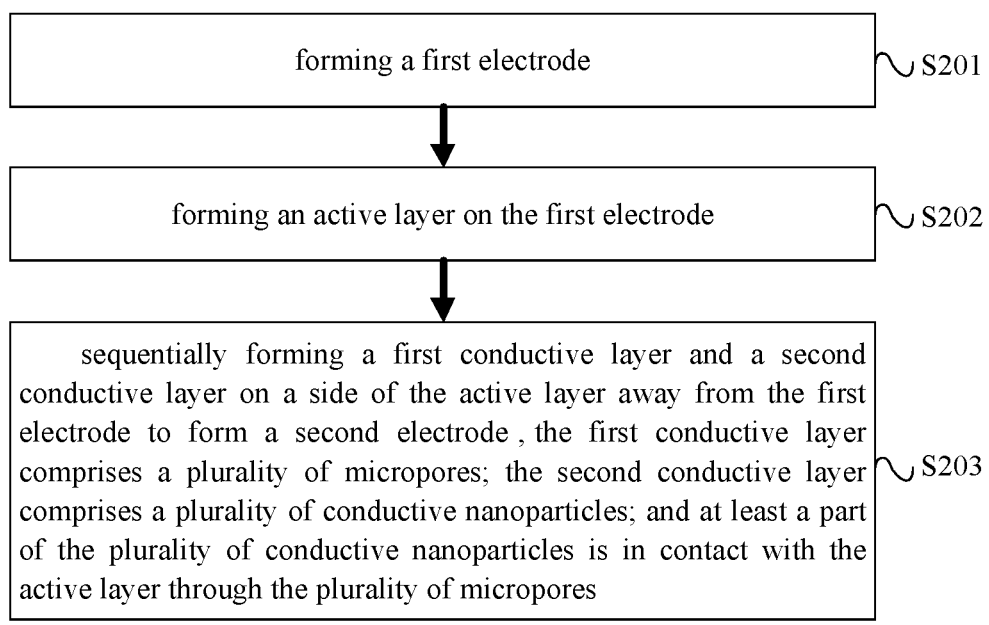
FIG. 6 is a flowchart of a manufacturing method of a light emitting diode, provided by an embodiment of the present disclosure.

An embodiment of the present disclosure further provides a manufacturing method of a light emitting diode. FIG. 6 is a flowchart of the manufacturing method of the light emitting diode provided by the embodiment. As illustrated by FIG. 6, the manufacturing method includes the steps S201-S203.

S201: forming a first electrode.

For example, the first electrode may be formed by methods such as deposition, sputtering or evaporation.

S202: forming an active layer on the first electrode.

S203: sequentially forming a first conductive layer and a second conductive layer on a side of the active layer away from the first electrode to form a second electrode, the second electrode includes the first conductive layer and the second conductive layer sequentially arranged along a direction away from the active layer; the first conductive layer includes a plurality of micropores; the second conductive layer includes a plurality of conductive nanoparticles; and at least a part of the plurality of conductive nanoparticles is in contact with the active layer through the plurality of micropores.

In the light emitting diode manufactured by the manufacturing method of the light emitting diode provided by the embodiment, the first conductive layer includes a plurality of micropores; the second conductive layer includes a plurality of conductive nanoparticles; and at least a part of the plurality of conductive nanoparticles is in contact with the active layer through the plurality of micropores, so there is electromagnetic interaction between the conductive nanoparticles and the active layer. Thus, because of the localized surface plasmons formed at the conductive nanoparticles, the coupling between an evanescent field of the surface plasmon and the electric dipole in the active layer transfers the energy of the electric dipole into the surface plasmon for emitting light, which provides an alternative light emitting method for the light emitting diode, so as to improve the luminous efficiency of the light emitting diode. In addition, the localized surface plasmons formed at the conductive nanoparticles can absorb and release the light emitted by the active layer through resonance effect of the localized surface plasmons, so as to improve the light extraction efficiency of the light emitting diode.

For example, a material of the first conductive layer may be aluminum, and a material of the second conductive layer may be silver.

For example, in some examples, the light emitting diode may be a top-emission structure. That is to say, the first electrode may be a reflective electrode, and the second electrode may be a semitransparent electrode. Thus the light emitted by the active layer can be reflected by the first electrode and emitted from a side provided with the second electrode.

For example, the first electrode may include a reflective layer and a transparent electrode on a side of the reflective layer close to the active layer.

For example, the reflective layer may be made from a metallic material with high reflectivity, e.g., silver, aluminum, or alloy of silver, lead and copper. Of course, the embodiments of the present disclosure include but are not limited thereto, and the reflective layer may also be made from other materials with high reflectivity.

For example, in some examples, the step S203 of sequentially forming the first conductive layer and the second conductive layer on a side of the active layer away from the first electrode to form the second electrode includes: forming the first conductive layer by forming a first metal layer on a side of the active layer away from the first electrode; forming a second metal layer on a side of the first conductive layer away from the active layer; and performing a thermal annealing process on the second metal layer to convert the second metal layer into the second conductive layer including the plurality of conductive nanoparticles. Thus, the second metal layer can be converted into the plurality of conductive nanoparticles by the thermal annealing process.

For example, in some examples, a thickness of the first metal layer is less than 10 nm. Thus, in the process of forming the first metal layer on a side of the active layer away from the first electrode, due to small thickness, the first metal layer will not form a continuous metal film layer but will naturally form a porous structure, namely a structure including a plurality of micropores. Thus, the plurality of micropores on the first conductive layer do not need to be formed by an additional step, so the production costs can be reduced.

For example, a surface of the active layer close to the first conductive layer may form a rough surface, so as to form the plurality of micropores on the first conductive layer.

For example, the active layer may include a plurality of functional layers, e.g., a hole transport layer, a light emitting layer or an electron transport layer. The functional layer of the active layer close to the first conductive layer may be made from ZnO or ZnMgO.

For example, in some examples, a temperature range of thermal annealing process is 120-180° C., and a time range of thermal annealing process is 20-80 min. It should be noted that in the abovementioned ranges, if the temperature of thermal annealing process is higher, the time of thermal annealing process is shorter; and if the temperature of thermal annealing process is lower, the time of thermal annealing process is longer.

For example, in some examples, the thermal annealing process is performed in a vacuum or nitrogen atmosphere, so as to prevent the second metal layer from being oxidized.

An embodiment of the present disclosure further provides a display device, which includes the light emitting diode provided by any abovementioned embodiment. Because the display device includes the light emitting diode provided by any abovementioned embodiment, the display device has the technical effects corresponding to the advantages of the above light emitting diode. For example, in the display device, the first conductive layer includes a plurality of micropores; the second conductive layer includes a plurality of conductive nanoparticles; and at least a part of the plurality of conductive nanoparticles is in contact with the active layer through the plurality of micropores, so there is electromagnetic interaction between the conductive nanoparticles and the active layer. Thus, because of the localized surface plasmons formed at the conductive nanoparticles, the coupling between an evanescent field of the surface plasmon and the electric dipole in the active layer transfers the energy of the electric dipole into the surface plasmon for emitting light, which provides an alternative light emitting method for the light emitting diode, so as to improve the luminous efficiency of the light emitting diode. In addition, the localized surface plasmons formed at the conductive nanoparticles can absorb and release the light emitted by the active layer through resonance effect of the localized surface plasmons, so as to improve the light extraction efficiency of the light emitting diode. Therefore, the display device has high luminous efficiency and low energy consumption.

For example, in some examples, the display device includes a plurality of light emitting diodes. The plurality of light emitting diodes can emit light of different colors.

For example, the plurality of light emitting diodes include light emitting diodes capable of emitting red light, light emitting diodes capable of emitting green light, and light emitting diodes capable of emitting blue light. Thus, the display device can realize full-color display through the above light emitting diodes.

For example, the display device may be an electronic device with display function such as a notebook computer, a navigator, a television or a mobile phone.

The following points should be noted:

(1) The accompanying drawings in the embodiments of the present disclosure only involve structures relevant to the embodiments of the present disclosure, and other structures may refer to the prior art.

(2) The features in the same embodiment or different embodiments of the present disclosure can be mutually combined without conflict.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A light emitting diode, comprising:
a first electrode;
an active layer on the first electrode; and
a second electrode on a side of the active layer away from the first electrode,
wherein the second electrode comprises a first conductive layer and a second conductive layer sequentially arranged along a direction away from the active layer, the first conductive layer comprises a plurality of micropores; the second conductive layer comprises a plurality of conductive nanoparticles, and at least a part of the plurality of conductive nanoparticles is in contact with the active layer through the plurality of micropores.

2. The light emitting diode according to claim 1, wherein a thickness of the first conductive layer is less than 10 nm.

3. The light emitting diode according to claim 2, wherein a thickness range of the second conductive layer is 10-15 nm.

4. The light emitting diode according to claim 1, wherein the plurality of micropores are irregularly arranged.

5. The light emitting diode according to claim 1, wherein a thickness range of the second conductive layer is 10-15 nm.

6. The light emitting diode according to claim 1, wherein a material of the first conductive layer comprises aluminum.

7. The light emitting diode according to claim 1, wherein a material of the second conductive layer comprises silver.

8. The light emitting diode according to claim 1, wherein the active layer comprises a hole transport layer, a light emitting layer and an electron transport layer sequentially arranged along a direction away from the first electrode.

9. The light emitting diode according to claim 8, wherein the light emitting layer comprises a quantum dot light emitting layer.

10. The light emitting diode according to claim 1, further comprising:
a cover layer located on a side of the second electrode away from the active layer and comprising a dielectric material, wherein the dielectric material is electrically conductive under a direct current or a low frequency current, and presents a dielectric property in an oscillating electric field with a frequency range of 3.0e+14 Hz to 3.0e+15 Hz.

11. The light emitting diode according to claim 10, wherein the dielectric material comprises indium zinc oxide (IZO), indium zinc oxide (IZO) or an organic semiconductor material.

12. A display device, comprising the light emitting diode according to claim 1.

13. A manufacturing method of a light emitting diode, comprising:
forming a first electrode;
forming an active layer on the first electrode; and
sequentially forming a first conductive layer and a second conductive layer on a side of the active layer away from the first electrode to form a second electrode,
wherein the first conductive layer comprises a plurality of micropores; the second conductive layer comprises a plurality of conductive nanoparticles; and at least a part of the plurality of conductive nanoparticles is in contact with the active layer through the plurality of micropores.

14. The manufacturing method of the light emitting diode according to claim 13, wherein sequentially forming the first conductive layer and the second conductive layer on the side of the active layer away from the first electrode to form the second electrode comprises:
forming a first metal layer on the side of the active layer away from the first electrode to form the first conductive layer, wherein a thickness of the first conductive layer is less than 10 nm, such that the plurality of micropores are formed in the first conductive layer;
forming a second metal layer on a side of the first conductive layer away from the active layer; and
performing a thermal annealing process on the second metal layer to convert the second metal layer into the second conductive layer comprising the plurality of conductive nanoparticles.

15. The manufacturing method of the light emitting diode according to claim 14, wherein a temperature range of thermal annealing process is 120-180° C., and a time range of thermal annealing process is 20-80 min.

16. The manufacturing method of the light emitting diode according to claim 14, wherein the thermal annealing process is performed in a vacuum or nitrogen atmosphere.

17. The manufacturing method of the light emitting diode according to claim 13, wherein a material of the first conductive layer comprises aluminum.

18. The manufacturing method of the light emitting diode according to claim 13, wherein a material of the second conductive layer comprises silver.

* * * * *